United States Patent
Ghoshal

(10) Patent No.: US 6,608,250 B2
(45) Date of Patent: Aug. 19, 2003

(54) ENHANCED INTERFACE THERMOELECTRIC COOLERS USING ETCHED THERMOELECTRIC MATERIAL TIPS

(75) Inventor: Uttam Shyamalindu Ghoshal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 09/731,614

(22) Filed: Dec. 7, 2000

(65) Prior Publication Data

US 2002/0092557 A1 Jul. 18, 2002

(51) Int. Cl.$^7$ ............................................. H01L 35/34
(52) U.S. Cl. ..................... 136/201; 136/203; 136/205; 438/745; 438/753; 205/667; 216/11; 216/13; 216/20; 216/38; 216/39; 216/49; 216/75; 216/88; 216/99
(58) Field of Search ................................ 136/201, 203, 136/205, 236.1, 238, 240; 62/3.3, 3.7; 257/15; 438/745, 753; 205/667; 216/11, 13, 20, 38, 39, 49, 75, 88, 99

(56) References Cited

U.S. PATENT DOCUMENTS

| | | | |
|---|---|---|---|
| 3,880,674 A | | 4/1975 | Saunders .................... 136/237 |
| 4,268,710 A | * | 5/1981 | Hampl, Jr. |
| 4,492,809 A | | 1/1985 | Dahlberg .................... 136/212 |
| 5,130,276 A | | 7/1992 | Adams et al. .............. 437/225 |
| 5,279,128 A | | 1/1994 | Tomatsu et al. .............. 62/3.4 |
| 5,712,448 A | | 1/1998 | Vandersande et al. ...... 136/203 |
| 5,867,990 A | | 2/1999 | Ghoshal ........................ 62/3.7 |
| 5,900,071 A | | 5/1999 | Harman .................... 136/236.1 |
| 5,966,941 A | | 10/1999 | Ghoshal ........................ 62/3.7 |
| 6,000,225 A | | 12/1999 | Ghoshal ........................ 62/3.7 |
| 6,161,388 A | | 12/2000 | Ghoshal ..................... 62/3.77 |

FOREIGN PATENT DOCUMENTS

| | | | |
|---|---|---|---|
| DE | 3404137 | 8/1985 | ........... H01L/35/08 |
| DE | 3404138 | 8/1985 | ........... H01L/35/08 |
| DE | 3818192 | 12/1989 | ........... H01L/35/06 |
| EP | 0437654 | 7/1991 | ........... H01L/35/00 |
| EP | 0 667 498 A1 | 8/1995 | |
| JP | 03155376 | 9/1991 | |
| JP | 05039966 | 2/1993 | |
| JP | 05172424 | 7/1993 | |
| JP | 5-266704 | * 9/1993 | |
| JP | 05226704 | 12/1993 | |
| WO | WO 94/28364 | 12/1994 | |
| WO | WO 98/44562 | * 10/1998 | |
| WO | WO 00/08693 | 2/2000 | |

OTHER PUBLICATIONS

Rinzler et al., "Large–Scale Purification of Single–Wall Carbon Nanotubes: Process, Product, and Characterization", Applied Physics A, 1998, pp. 29–37.

Smalley, Tubes@Rice, http://cnst.rice.edu/tubes/, Apr. 8, 1999, 8 pages.

Http://www.tellurex.com/resource/txfaqc.htm, Aug. 15, 1999, pp. 1–30 "Frequently Ask Questions", Tellurex Corporation.

(List continued on next page.)

Primary Examiner—Nam Nguyen
Assistant Examiner—Thomas H. Parsons
(74) Attorney, Agent, or Firm—Duke W. Yee; Casimer K. Salys; Stephen R. Loe

(57) ABSTRACT

A thermoelectric device with improved efficiency is provided. In one embodiment, the thermoelectric device includes an electrical conductor thermally coupled to a cold plate and a thermoelement electrically coupled to the electrical conductor. The thermoelement is constructed from a thermoelectric material and has a plurality of tips through which the thermoelement is electrically coupled to the electrical conductor. The thermoelectric tips provide a low resistive connection while minimizing thermal conduction between the electrical conductor and the thermoelement.

23 Claims, 7 Drawing Sheets

OTHER PUBLICATIONS

Http://www.tellurex.com/resource/introc.htm, Aug. 15, 1999, pp. 1–7 "An Introduction to Thermoelectrics", Tellurex Corporation.

Lui et al., "Fullerene Pipes", www.sciencemag.org, *Science*, vol. 280, May 22, 1998, pp. 1253–1255.

Thess et al., "Crystalline Ropes of Metallic Carbon Nanotubes", *Science*, vol. 273, Jul. 26, 1996, pp. 483–487.

Lenoir, B.; Dauscher, A., Devaux, X., Martin–Lopez, R., Ravich, Yu I., Scherrer, H., "Bi–Sb alloys; an update", 15th International Conference on Thermoelectrics, Mar. 1996, pp. 1–13.*

Sungtaek et al., "Study fo Interface Effects in Thermoelectric Microrefrigerators", Journal of Applied Physics, American Institute of Physics, New York, US, vol. 88, No. 7, Oct. 1,2000, pp. 4136–4139.

Ghoshal et al., "Refrigeration Technologies for Sub–Ambient Temperature Operation of Computing Systems", 2000 IEEE Internatianal Solid–State Circuits conference. Digest of Technical Paters (CAT No. 00CH37056), San Francisco CA, USA, Feb. 7–9, 2000, pp. 216–217.

\* cited by examiner

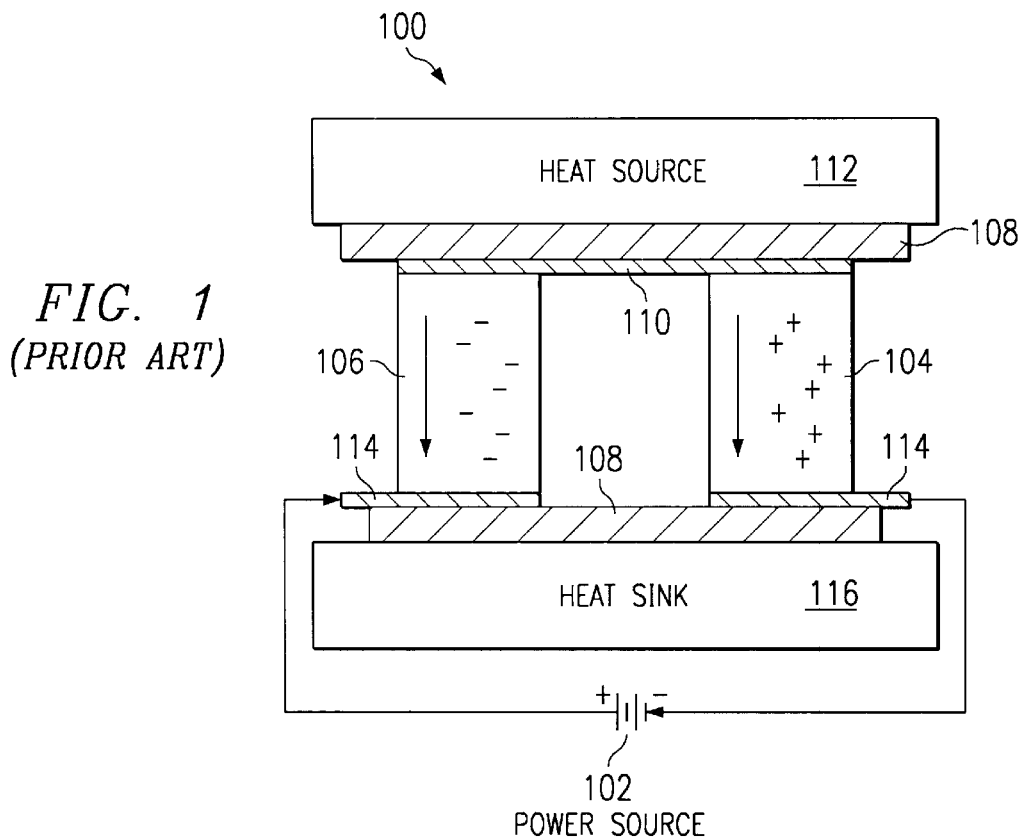
*FIG. 1*
*(PRIOR ART)*
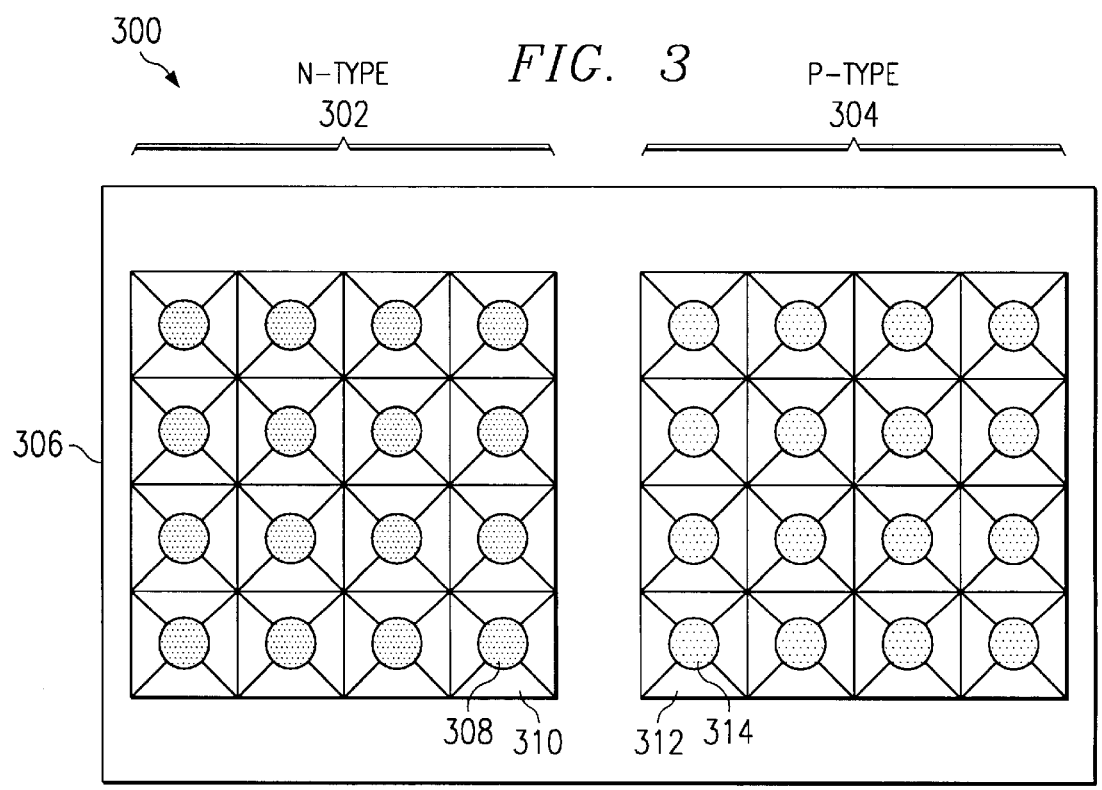

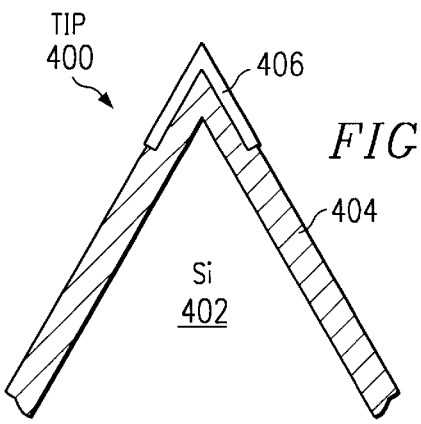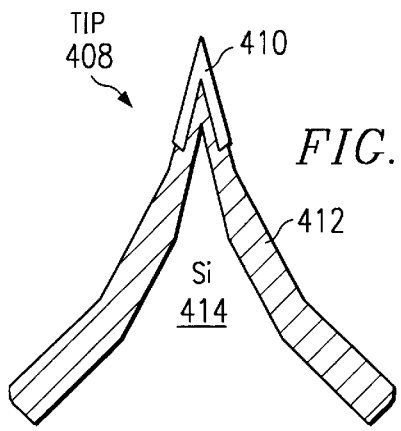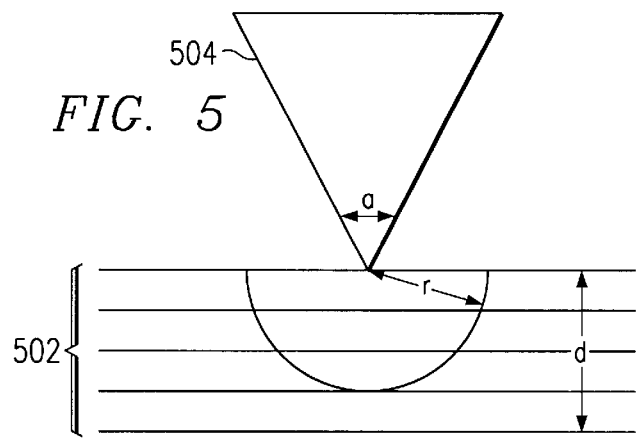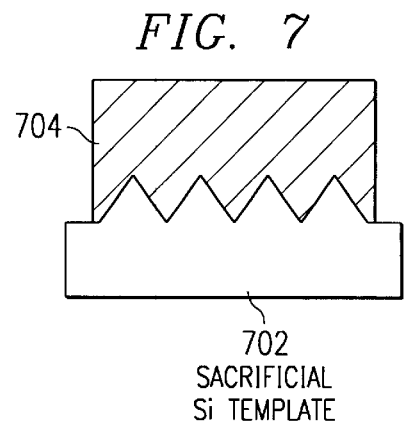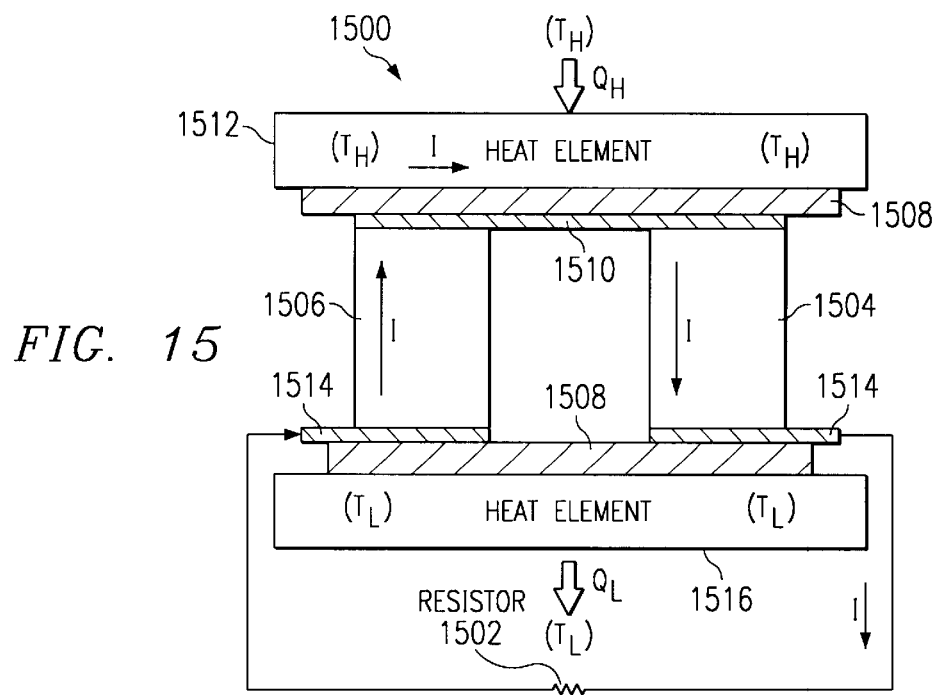

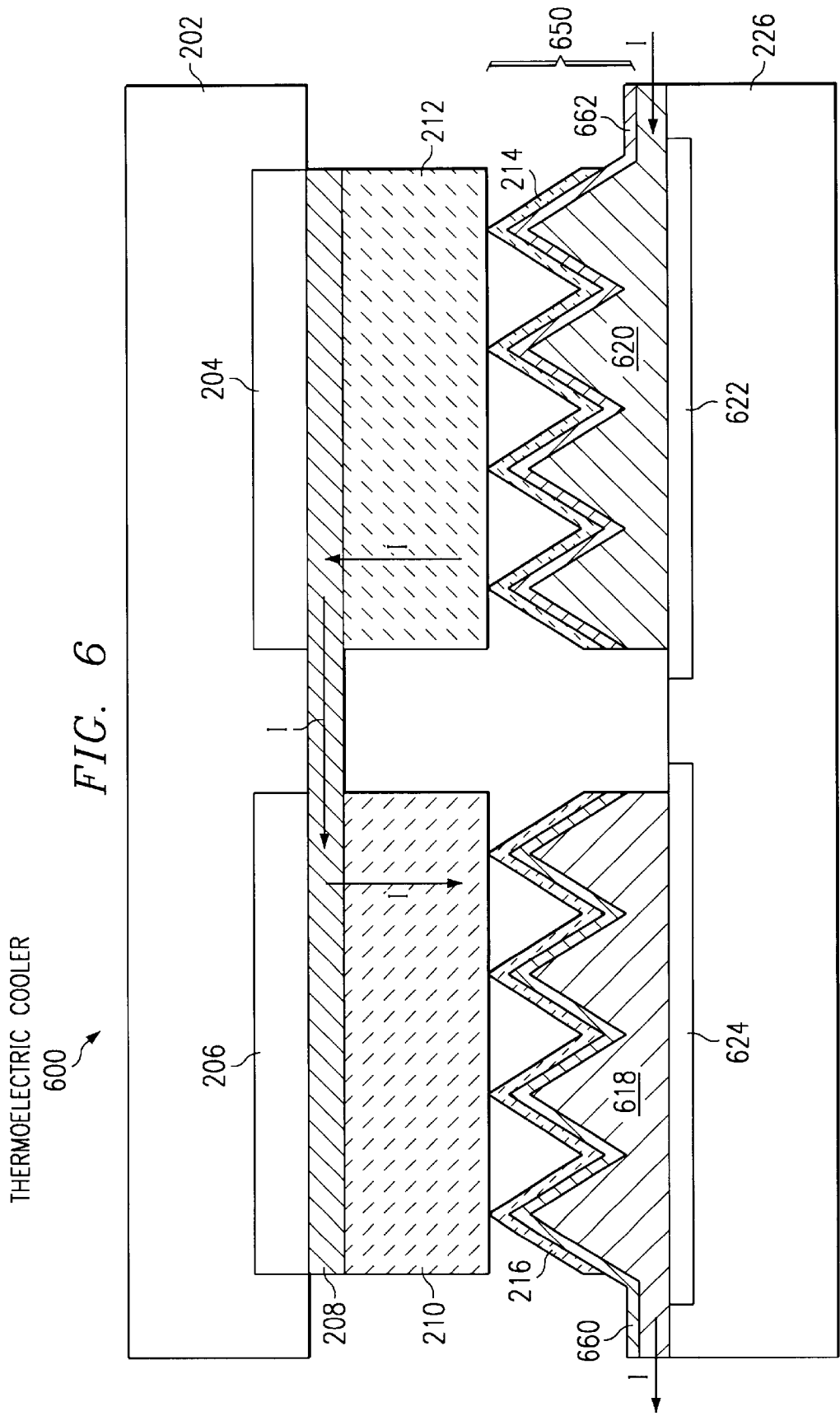

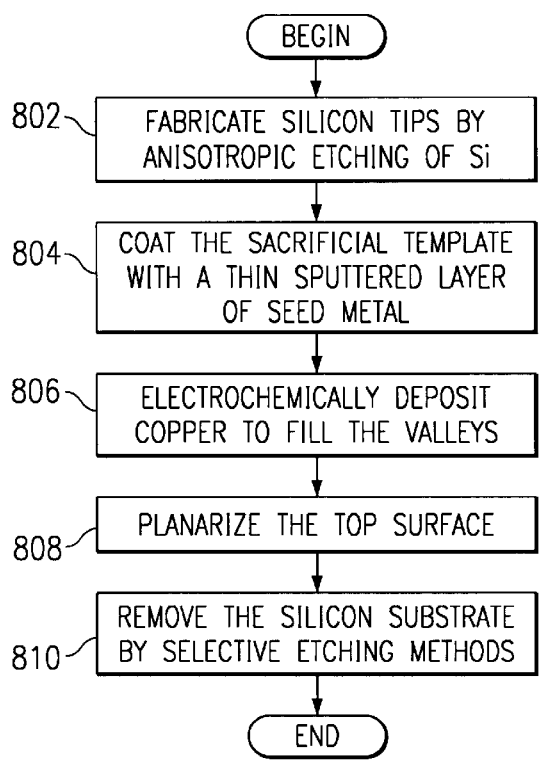
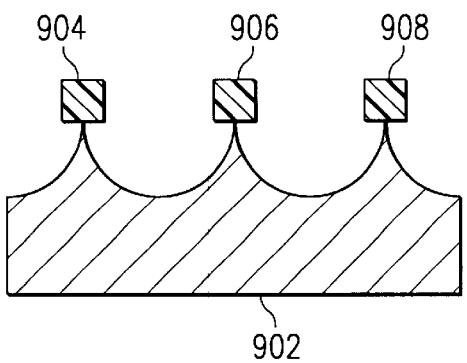
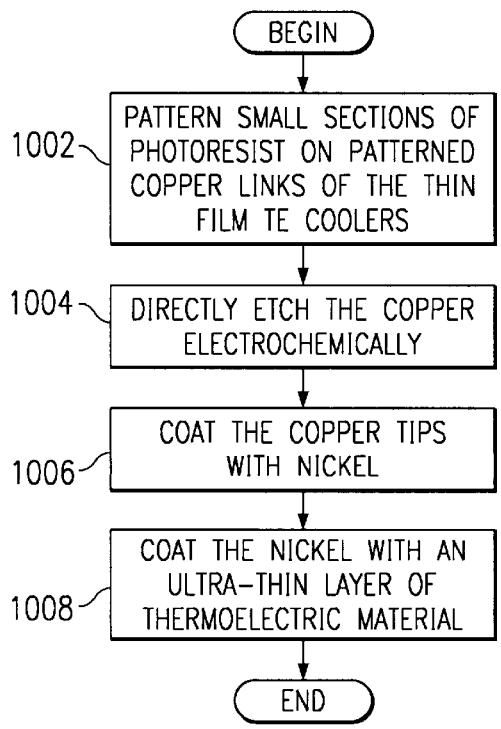
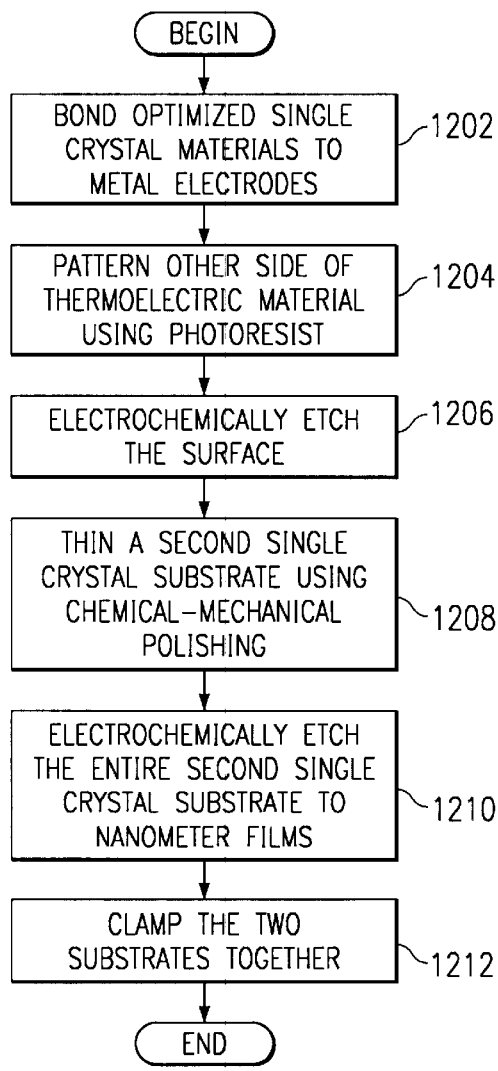

ENHANCED INTERFACE THERMOELECTRIC COOLERS USING ETCHED THERMOELECTRIC MATERIAL TIPS

CROSS REFERENCE TO RELATED APPLICATIONS

The present application is related to co-pending U.S. patent application Ser. No. 09/731,616 entitled "ENHANCED INTERFACE THERMOELECTRIC COOLERS WITH ALL-METAL TIPS" filed Dec. 7, 2000, to co-pending U.S. patent application Ser. No. 09/731,997 entitled "THERMOELECTRIC COOLERS WITH ENHANCED STRUCTURED INTERFACES" filed Dec. 7, 2000, (now U.S. Pat No. 6,384,312), and to co-pending U.S. patent application Ser. No. 09/731,614 entitled "ENHANCED INTERFACE THERMOELECTRIC COOLERS USING ETCHED THERMOELECTRIC MATERIAL TIPS" filed on Dec. 7, 2000. The content of the above mentioned commonly assigned, co-pending U.S. patent applications are hereby incorporated herein by reference for all purposes.

BACKGROUND OF THE INVENTION

1. Technical Field

The present invention relates to devices for cooling substances such as, for example, integrated circuit chips, and more particularly, the present invention relates to thermoelectric coolers.

2. Description of Related Art

As the speed of computers continues to increase, the amount of heat generated by the circuits within the computers continues to increase. For many circuits and applications, increased heat degrades the performance of the computer. These circuits need to be cooled in order to perform most efficiently. In many low end computers, such as personal computers, the computer may be cooled merely by using a fan and fins for convective cooling. However, for larger computers, such as main frames, that perform at faster speeds and generate much more heat, these solutions are not viable.

Currently, many main frames utilize vapor compression coolers to cool the computer. These vapor compression coolers perform essentially the same as the central air conditioning units used in many homes. However, vapor compression coolers are quite mechanically complicated requiring insulation and hoses that must run to various parts of the main frame in order to cool the particular areas that are most susceptible to decreased performance due to overheating.

A much simpler and cheaper type of cooler are thermoelectric coolers. Thermoelectric coolers utilize a physical principle known as the Peltier Effect, by which DC current from a power source is applied across two dissimilar materials causing heat to be absorbed at the junction of the two dissimilar materials. Thus, the heat is removed from a hot substance and may be transported to a heat sink to be dissipated, thereby cooling the hot substance. Thermoelectric coolers may be fabricated within an integrated circuit chip and may cool specific hot spots directly without the need for complicated mechanical systems as is required by vapor compression coolers.

However, current thermoelectric coolers are not as efficient as vapor compression coolers requiring more power to be expended to achieve the same amount of cooling. Furthermore, current thermoelectric coolers are not capable of cooling substances as greatly as vapor compression coolers. Therefore, a thermoelectric cooler with improved efficiency and cooling capacity would be desirable so that complicated vapor compression coolers could be eliminated from small refrigeration applications, such as, for example, main frame computers, thermal management of hot chips, RF communication circuits, magnetic read/write heads, optical and laser devices, and automobile refrigeration systems.

SUMMARY OF THE INVENTION

The present invention provides a thermoelectric device with improved efficiency is provided. In one embodiment, the thermoelectric device includes an electrical conductor thermally coupled to a cold plate and a thermoelement electrically coupled to the electrical conductor. The thermoelement is constructed from a thermoelectric material and has a plurality of tips through which the thermoelement is electrically coupled to the electrical conductor. The thermoelectric tips provide a low resistive connection while minimizing thermal conduction between the electrical conductor and the thermoelement.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 1 depicts a high-level block diagram of a Thermoelectric Cooling (TEC) device in accordance with the prior art;

FIG. 3 depicts a planer view of thermoelectric cooler 200 in FIG. 2 in accordance with the present invention;

FIGS. 4A and 4B depicts cross sectional views of tips that may be implemented as one of tips 250 in FIG. 2 in accordance with the present invention;

FIG. 5 depicts a cross sectional view illustrating the temperature field of a tip near to a superlattice in accordance with the present invention;

FIG. 6 depicts a cross sectional view of a thermoelectric cooler with enhanced structured interfaces with all metal tips in accordance with the present invention;

FIG. 7 depicts a cross-sectional view of a sacrificial silicon template for forming all metal tips in accordance with the present invention;

FIG. 8 depicts a flowchart illustrating an exemplary method of producing all metal cones using a silicon sacrificial template in accordance with the present invention;

FIG. 9 depicts a cross sectional view of all metal cones formed using patterned photoresist in accordance with the present invention;

FIG. 10 depicts a flowchart illustrating an exemplary method of forming all metal cones using photoresist in accordance with the present invention;

FIG. 12 depicts a flowchart illustrating an exemplary method of fabricating a thermoelectric cooler in accordance with the present invention;

FIG. 15 depicts a schematic diagram of a thermoelectric power generator.

DETAILED DESCRIPTION OF THE PREFERRED EMBODIMENT

Figure 2:
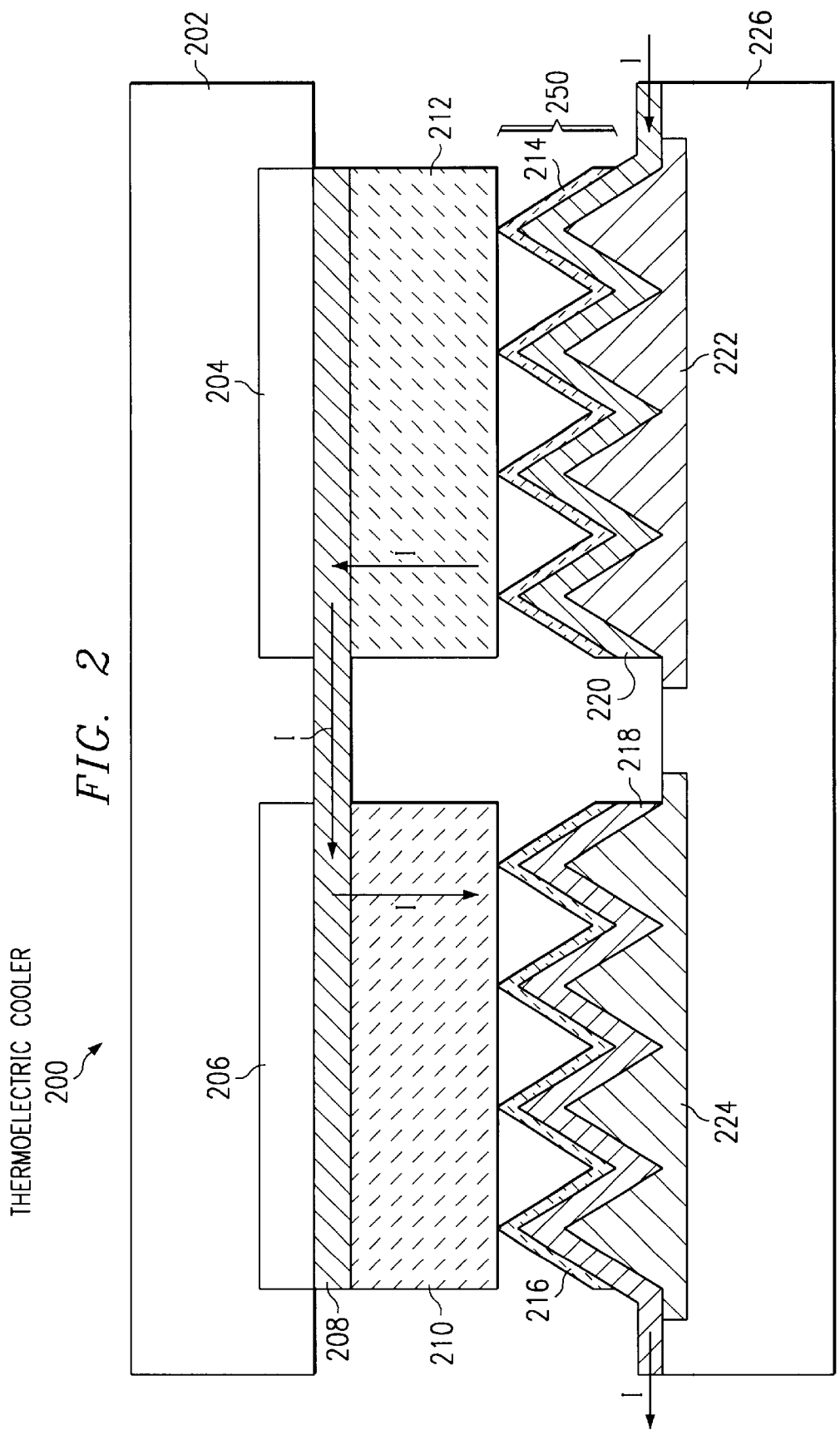
FIG. 2 depicts a cross sectional view of a thermoelectric cooler with enhanced structured interfaces in accordance with the present invention.

With reference now to the figures and, in particular, with reference to FIG. 1, a high-level block diagram of a Thermoelectric Cooling (TEC) device is depicted in accordance with the prior art. Thermoelectric cooling, a well known principle, is based on the Peltier Effect, by which DC current from power source 102 is applied across two dissimilar materials causing heat to be absorbed at the junction of the two dissimilar materials. A typical thermoelectric cooling device utilizes p-type semiconductor 104 and n-type semiconductor 106 sandwiched between poor electrical conductors 108 that have good heat conducting properties. N-type semiconductor 106 has an excess of electrons, while p-type semiconductor 104 has a deficit of electrons.

As electrons move from electrical conductor 110 to n-type semiconductor 106, the energy state of the electrons is raised due to heat energy absorbed from heat source 112. This process has the effect of transferring heat energy from heat source 112 via electron flow through n-type semiconductor 106 and electrical conductor 114 to heat sink 116. The electrons drop to a lower energy state and release the heat energy in electrical conductor 114.

The coefficient of performance, $\eta$, of a cooling refrigerator, such as thermoelectric cooler 100, is the ratio of the cooling capacity of the refrigerator divided by the total power consumption of the refrigerator. Thus the coefficient of performance is given by the equation:

$$\eta = \frac{\alpha I T_c - \frac{1}{2} I^2 R - K\Delta T}{I^2 R + \alpha I \Delta T}$$

where the term $\alpha I T_c$ is due to the thermoelectric cooling, the term $\frac{1}{2} I^2 R$ is due to Joule heating backflow, the term $K\Delta T$ is due to thermal conduction, the term $I^2 R$ is due to Joule loss, the term $\alpha I \Delta T$ is due to work done against the Peltier voltage, $\alpha$ is the Seebeck coefficient for the material, $T_c$ is the temperature of the heat source, and $\Delta T$ is the difference in the temperature of the heat source form the temperature of the heat sink.

The maximum coefficient of performance is derived by optimizing the current, I, and is given by the following relation:

$$\eta_{max} = \left(\frac{T_c}{\Delta T}\right)\left[\frac{\gamma - \frac{T_h}{T_c}}{\gamma + 1}\right]$$

where $$\gamma = \sqrt{1 + \frac{\alpha^2 \sigma}{\lambda}\left(\frac{T_h + T_c}{2}\right)} \text{ and}$$

$$\varepsilon = \frac{\gamma - \frac{T_h}{T_c}}{\gamma + 1}$$

where $\varepsilon$ is the efficiency factor of the refrigerator.

The figure of merit, ZT, is given by the equation:

$$ZT = \frac{\alpha^2 \sigma T}{\lambda}$$

where $\lambda$ is composed of two components: $\lambda_e$, the component due to electrons, and $\lambda_L$, the component due to the lattice. Therefore, the maximum efficiency, $\varepsilon$, is achieved as the figure of merit, ZT, approaches infinity. The efficiency of vapor compressor refrigerators is approximately 0.3. The efficiency of conventional thermoelectric coolers, such as thermoelectric cooler 100 in FIG. 1, is typically less than 0.1. Therefore, to increase the efficiency of thermoelectric coolers to such a range as to compete with vapor compression refrigerators, the figure of merit, ZT, must be increased to greater than 2. If a value for the figure of merit, ZT, of greater than 2 can be achieved, then the thermoelectric coolers may be staged to achieve the same efficiency and cooling capacity as vapor compression refrigerators.

With reference to FIG. 2, a cross sectional view of a thermoelectric cooler with enhanced structured interfaces is depicted in accordance with the present invention. Thermoelectric cooler 200 includes a heat source 226 from which, with current I flowing as indicated, heat is extracted and delivered to heat sink 202. Heat source 226 may be thermally coupled to a substance that is desired to be cooled. Heat sink 202 may be thermally coupled to devices such as, for example, a heat pipe, fins, and/or a condensation unit to dissipate the heat removed from heat source 226 and/or further cool heat source 226.

Heat source 226 is comprised of p– type doped silicon. Heat source 226 is thermally coupled to n+ type doped silicon regions 224 and 222 of tips 250. N+ type regions 224 and 222 are electrical conducting as well as being good thermal conductors. Each of N+ type regions 224 and 222 forms a reverse diode with heat source 226 such that no current flows between heat source 226 and n+ regions 224 and 222, thus providing the electrical isolation of heat source 226 from electrical conductors 218 and 220.

Heat sink 202 is comprised of p– type doped silicon. Heat sink 202 is thermally coupled to n+ type doped silicon regions 204 and 206. N+ type regions 204 and 206 are electrically conducting and good thermal conductors. Each of N+ type regions 204 and 206 and heat sink 202 forms a reverse diode so that no current flows between the N+ type regions 204 and 206 and heat sink 202, thus providing the electrical isolation of heat sink 202 from electrical conductor 208. More information about electrical isolation of thermoelectric coolers may be found in commonly U.S. patent application Ser. No. 09/458,270 entitled "Electrically Isolated Ultra-Thin Substrates for Thermoelectric Coolers" assigned to the International Business Machines Corporation of Armonk, N.Y. and filed on Dec. 9, 1999, now U.S. Pat. No. 6,222,133, the contents of which are hereby incorporated herein for all purposes.

The need for forming reverse diodes with n+ and p– regions to electrically isolate conductor 208 from heat sink 202 and conductors 218 and 220 from heat source 226 is not needed if the heat sink 202 and heat source 226 are constructed entirely from undoped non-electrically conducting silicon. However, it is very difficult to ensure that the silicon is entirely undoped. Therefore, the presence of the reverse diodes provided by the n+ and p− regions ensures that heat sink 202 and heat source 226 are electrically isolated from conductors 208, 218, and 220. Also, it should be noted that the same electrical isolation using reverse diodes may be created other ways, for example, by using p+ type doped silicon and n− type doped silicon rather than the p− and n+ types depicted. The terms n+ and p+, as used herein, refer to highly n doped and highly p doped semiconducting material respectively. The terms n− and p−, as used herein, mean lightly n doped and lightly p doped semiconducting material respectively.

Thermoelectric cooler 200 is similar in construction to thermoelectric cooler 100 in FIG. 1. However, N-type 106 and P-type 104 semiconductor structural interfaces have been replaced with superlattice thermoelement structures 210 and 212 that are electrically coupled by electrical conductor 208. Electrical conductor 208 may be formed from platinum (Pt) or, alternatively, from other conducting materials, such as, for example, tungsten (W), nickel (Ni), or titanium copper nickel (Ti/Cu/Ni) metal films.

A superlattice is a structure consisting of alternating layers of two different semiconductor materials, each several nanometers thick. Thermoelement 210 is constructed from alternating layers of N-type semiconducting materials and the superlattice of thermoelement 212 is constructed from alternating layers of P-type semiconducting materials. Each of the layers of alternating materials in each of thermoelements 210 and 212 is 10 nanometers (nm) thick. A superlattice of two semiconducting materials has lower thermal conductivity, $\lambda$, and the same electrical conductivity, $\sigma$, as an alloy comprising the same two semiconducting materials.

In one embodiment, superlattice thermoelement 212 comprises alternating layers of p-type bismuth chalcogenide materials such as, for example, alternating layers of $Bi_2Te_3$/$Sb_2Te_3$ with layers of $Bi_{0.5}Sb_{1.5}Te_3$, and the superlattice of thermoelement 210 comprises alternating layers of n-type bismuth chalcogenide materials, such as, for example, alternating layers of $Bi_2Te_3$ with layers of $Bi_2Se_3$. Other types of semiconducting materials may be used for superlattices for thermoelements 210 and 212 as well. For example, rather than bismuth chalcogenide materials, the superlattices of thermoelements 210 and 212 may be constructed from cobalt antimony skutterudite materials.

Thermoelectric cooler 200 also includes tips 250 through which electrical current I passes into thermoelement 212 and then from thermoelement 210 into conductor 218. Tips 250 includes n+ type semiconductor 222 and 224 formed into pointed conical structures with a thin overcoat layer 218 and 220 of conducting material, such as, for example, platinum (Pt). Other conducting materials that may be used in place of platinum include, for example, tungsten (W), nickel (Ni), and titanium copper nickel (Ti/Cu/Ni) metal films. The areas between and around the tips 250 and thermoelectric materials 210 and 212 should be evacuated or hermetically sealed with a gas such as, for example, dry nitrogen.

On the ends of tips 250 covering the conducting layers 218 and 220 is a thin layer of semiconducting material 214 and 216. Layer 214 is formed from a P-type material having the same Seebeck coefficient, $\alpha$, as the nearest layer of the superlattice of thermoelement 212 to tips 250. Layer 216 is formed from an N-type material having the same Seebeck coefficient, $\alpha$, as the nearest layer of thermoelement 210 to tips 250. The P-type thermoelectric overcoat layer 214 is necessary for thermoelectric cooler 200 to function since cooling occurs in the region near the metal where the electrons and holes are generated. The n-type thermoelectric overcoat layer 216 is beneficial, because maximum cooling occurs where the gradient (change) of the Seebeck coefficient is maximum. The thermoelectric overcoat 214 for the P-type region is approximately 60 nm thick. A specific thickness of the n-type thermoelectric overcoat 216 has yet to be fully refined, but it is anticipated that it should be in a similar thickness range to the thickness of the thermoelectric overcoat 214.

By making the electrical conductors, such as, conductors 110 in FIG. 1, into pointed tips 250 rather than a planer interface, an increase in cooling efficiency is achieved. Lattice thermal conductivity, $\lambda$, at the point of tips 250 is very small because of lattice mismatch. For example, the thermal conductivity, $\lambda$, of bismuth chalcogenides is normally approximately 1 Watt/meter*Kelvin. However, in pointed tip structures, such as tips 250, the thermal conductivity is reduced, due to lattice mismatch at the point, to approximately 0.2 Watts/meter*Kelvin. However, the electrical conductivity of the thermoelectric materials remains relatively unchanged. Therefore, the figure of merit, ZT, may increased to greater than 2.5 for this kind of material. Another type of material that is possible for the superlattices of thermoelements 210 and 212 is cobalt antimony skutterudite. These type of materials typically have a very high thermal conductivity, $\lambda$, making them normally undesirable. However, by using the pointed tips 250, the thermal conductivity can be reduced to a minimum and produce a figure of merit, ZT, for these materials of greater than 4, thus making these materials very attractive for use in thermoelements 210 and 212. Therefore, the use of pointed tips 250 further increases the efficiency of the thermoelectric cooler 200 such that it is comparable to vapor compression refrigerators.

Another advantage of the cold point structure is that the electrons are confined to dimensions smaller than the wavelength (corresponding to their kinetic energy). This type of confinement increases the local density of states available for transport and effectively increases the Seebeck coefficient. Thus, by increasing $\alpha$ decreasing $\lambda$, the figure of merit ZT is increased.

Normal cooling capacity of conventional thermoelectric coolers, such as illustrated in FIG. 1, are capable of producing a temperature differential, $\Delta T$, between the heat source and the heat sink of around 60 Kelvin. However, thermoelectric cooler 200 is capable of producing a temperature differential on the order of 150 Kelvin. Thus, with two thermoelectric coolers coupled to each other, cooling to temperatures in the range of liquid nitrogen (less than 100 Kelvin) is possible. However, different materials may need to be used for thermoelements 210 and 212. For example, bismuth telluride has a very low a at low temperature (i.e. less than −100 degrees Celsius). However, bismuth antimony alloys perform well at low temperature.

Another advantage of the cobalt antimony skutterudite materials over the bismuth chalcogenide materials, not related to temperature, is the fact that cobalt antimony skutterudite materials are structurally more stable whereas the bismuth chalcogenide materials are structurally weak.

Those of ordinary skill in the art will appreciate that the construction of the thermoelectric cooler in FIG. 2 may vary depending on the implementation. For example, more or fewer rows of tips 250 may be included than depicted in FIG. 1. The depicted example is not meant to imply architectural limitations with respect to the present invention.

With reference now to FIG. 3, a planer view of thermoelectric cooler 200 in FIG. 2 is depicted in accordance with the present invention. Thermoelectric cooler 300 includes an n-type thermoelectric material section 302 and a p-type thermoelectric material section 304. Both n-type section 302 and p-type section 304 include a thin layer of conductive material 306 that covers a silicon body.

Section 302 includes an array of conical tips 310 each covered with a thin layer of n-type material 308 of the same type as the nearest layer of the superlattice for thermoelement 210. Section 304 includes an array of conical tips 312 each covered with a thin layer of p-type material 314 of the same type as the nearest layer of the superlattice for thermoelement 212.

With reference now to FIGS. 4A and 4B, a cross sectional views of tips that may be implemented as one of tips 250 in FIG. 2 is depicted in accordance with the present invention. Tip 400 includes a silicon cone that has been formed with a cone angle of approximately 35 degrees. A thin layer 404 of conducting material, such as platinum (Pt), overcoats the silicon 402. A thin layer of thermoelectric material 406 covers the very end of the tip 400. The cone angle after all layers have been deposited is approximately 45 degrees. The effective tip radius of tip 400 is approximately 50 nanometers.

Tip 408 is an alternative embodiment of a tip, such as one of tips 250. Tip 408 includes a silicon cone 414 with a conductive layer 412 and thermoelectric material layer 410 over the point. However, tip 408 has a much sharper cone angle than tip 400. The effective tip radius of tip 408 is approximately 10 nanometers. It is not known at this time whether a broader or narrower cone angle for the tip is preferable. In the present embodiment, conical angles of 45 degrees for the tip, as depicted in FIG. 4A, have been chosen, since such angle is in the middle of possible ranges of cone angle and because such formation is easily formed with silicon with a platinum overcoat. This is because a KOH etch along the 100 plane of silicon naturally forms a cone angle of 54 degrees. Thus, after the conductive and thermoelectric overcoats have been added, the cone angle is approximately 45 degrees.

With reference now to FIG. 5, a cross sectional view illustrating the temperature field of a tip near to a superlattice is depicted in accordance with the present invention. Tip 504 may be implemented as one of tips 250 in FIG. 2. Tip 504 has a effective tip radius, a, of 30–50 nanometers. Thus, the temperature field is localized to a very small distance, r, approximately equal to 2a or around 60–100 nanometers. Therefore, a superlattice 502 need to be only a few layers thick with a thickness, d, of around 100 nanometers. Therefore, using pointed tips, a thermoelectric cooler with only 5–10 layers for the superlattice is sufficient.

Thus, fabricating a thermoelectric cooler, such as, for example, thermoelectric cooler 200, is not extremely time consuming, since only a few layers of the superlattice must be formed rather than numerous layers which can be very time consuming. Thus, thermoelectric cooler 200 can be fabricated very thin (on the order of 100 nanometers thick) as contrasted to prior art thermoelectric coolers which were on the order of 3 millimeters or greater in thickness.

Other advantages of a thermoelectric cooler with pointed tip interfaces in accordance with the present invention include minimization of the thermal conductivity of the thermoelements, such as thermoelements 210 and 212 in FIG. 2, at the tip interfaces. Also, the temperature/potential drops are localized to an area near the tips, effectively achieving scaling to sub-100-nanometer lengths.

Furthermore, using pointed tips minimizes the number of layers for superlattice growth by effectively reducing the thermoelement lengths. The present invention also permits electrodeposition of thin film structures and avoids flip-chip bonds. The smaller dimensions allow for monolithic integration of n-type and p-type thermoelements.

The thermoelectric cooler of the present invention may be utilized to cool items, such as, for example, specific spots within a main frame computer, lasers, optic electronics, photodetectors, and PCR in genetics.

With reference now to FIG. 6, a cross sectional view of a thermoelectric cooler with enhanced structured interfaces with all metal tips is depicted in accordance with the present invention. Although the present invention has been described above as having tips 250 constructed from silicon cones constructed from the n+ semiconducting regions 224 and 222, tips 250 in FIG. 2 may be replaced by tips 650 as depicted in FIG. 6. Tips 650 have all metal cones 618 and 620. In the depicted embodiment, cones 618 and 620 are constructed from copper and have a nickel overcoat layer 660 and 662. Thermoelectric cooler 600 is identical to thermoelectric cooler 200 in all other respects, including having a thermoelectric overcoat 216 and 214 over the tips 650. Thermoelectric cooler 600 also provides the same benefits as thermoelectric cooler 200. However, by using all metal cones rather than silicon cones covered with conducting material, the parasitic resistances within the cones become very low, thus further increasing the efficiency of thermoelectric cooler 600 over the already increased efficiency of thermoelectric cooler 200. The areas surrounding tips 650 and between tips 650 and thermoelectric materials 210 and 212 should be vacuum or hermetically sealed with a gas, such as, for example, dry nitrogen.

Also, as in FIG. 2, heat source 226 is comprised of p− type doped silicon. In contrast to FIG. 2, however, heat source 226 is thermally coupled to n+ type doped silicon regions 624 and 622 that do not form part of the tipped structure 650 rather than to regions that do form part of the tipped structure as do regions 224 and 222 do in FIG. 2. N+ type doped silicon regions 624 and 622 do still perform the electrical isolation function performed by regions 224 and 222 in FIG. 2.

Several methods may be utilized to form the all metal cones as depicted in FIG. 6. For example, with reference now to FIG. 7, a cross-sectional view of a sacrificial silicon template that may be used for forming all metal tips is depicted in accordance with the present invention. After the sacrificial silicon template 702 has been constructed having conical pits, a layer of metal may be deposited over the template 702 to produce all metal cones 704. All metal cones 704 may then be used in thermoelectric cooler 600.

With reference now to FIG. 8, a flowchart illustrating an exemplary method of producing all metal cones using a silicon sacrificial template is depicted in accordance with the present invention. To begin, conical pits are fabricated by anisotropic etching of silicon to create a mold (step 802). This may be done by a combination of KOH etching, oxidation, and/or focused ion-beam etching. Such techniques of fabricating a silicon cone are well known in the art.

The silicon sacrificial template is then coated with a thin sputtered layer of seed metal, such as, for example, titanium or platinum (step 804). Titanium is preferable since platinum forms slightly more rounded tips than titanium, which is very conforming to the conical pits. Next, copper is electrochemically deposited to fill the valleys (conical pits) in the sacrificial silicon template. (step 806). The top surface of the copper is then planarized (step 808). Methods of planarizing a layer of metal are well known in the art. The silicon oxide (SiO$_2$) substrate is then removed by selective etching methods well known in the art (step 810). The all metal cones produced in this manner may then be covered with a coat of another metal, such as, for example, nickel or titanium and then with an ultra-thin layer of thermoelectric material. The nickel or titanium overcoat aids in electrodeposition of the thermoelectric material overcoat.

One advantage to this method of producing all metal cones is that the mold that is produced is reusable. The mold may be reused up to around 10 times before the mold degrades and becomes unusable. Forming a template in this manner is very well controlled and produces very uniform all metal conical tips since silicon etching is very predictable and can calculate slopes of the pits and sharpness of the cones produced to a very few nanometers.

Other methods of forming all metal cones may be used as well. For example, with reference now to FIG. 9, a cross sectional view of all metal cones 902 formed using patterned photoresist is depicted in accordance with the present invention. In this method, a layer of metal is formed over the bottom portions of a partially fabricated thermoelectric cooler. A patterned photoresist 904–908 is then used to fashion all metal cones 902 with a direct electrochemical etching method.

With reference now to FIG. 10, a flowchart illustrating an exemplary method of forming all metal cones using photoresist is depicted in accordance with the present invention. To begin, small sections of photoresist are patterned over a metal layer, such as copper, of a partially fabricated thermoelectric cooler, such as thermoelectric cooler 600, in FIG. 6 (step 1002). The photoresist may be patterned in an array of sections having photoresist wherein each area of photoresist within the array corresponds to areas in which tips to the all metal cones are desired to be formed. The metal is then directly etched electrochemically (step 1004) to produce cones 902 as depicted in FIG. 9. The photoresist is then removed and the tips of the all metal cones may then be coated with another metal, such as, for example, nickel (step 1006). The second metal coating over the all metal cones may then be coated with an ultra-thin layer of thermoelectric material (step 1008). Thus, all metal cones with a thermoelectric layer on the tips may be formed which may used in a thermoelectric device, such as, for example, thermoelectric cooler 600. The all metal conical points produced in this manner are not as uniform as those produced using the method illustrated in FIG. 8. However, this method currently is cheaper and therefore, if cost is an important factor, may be a more desirable method.

The depicted methods of fabricating all metal cones are merely examples. Other methods may be used as well to fabricate all metal cones for use with thermoelectric coolers. Furthermore, other types of metals may be used for the all metal cone other than copper.

Figure 11:
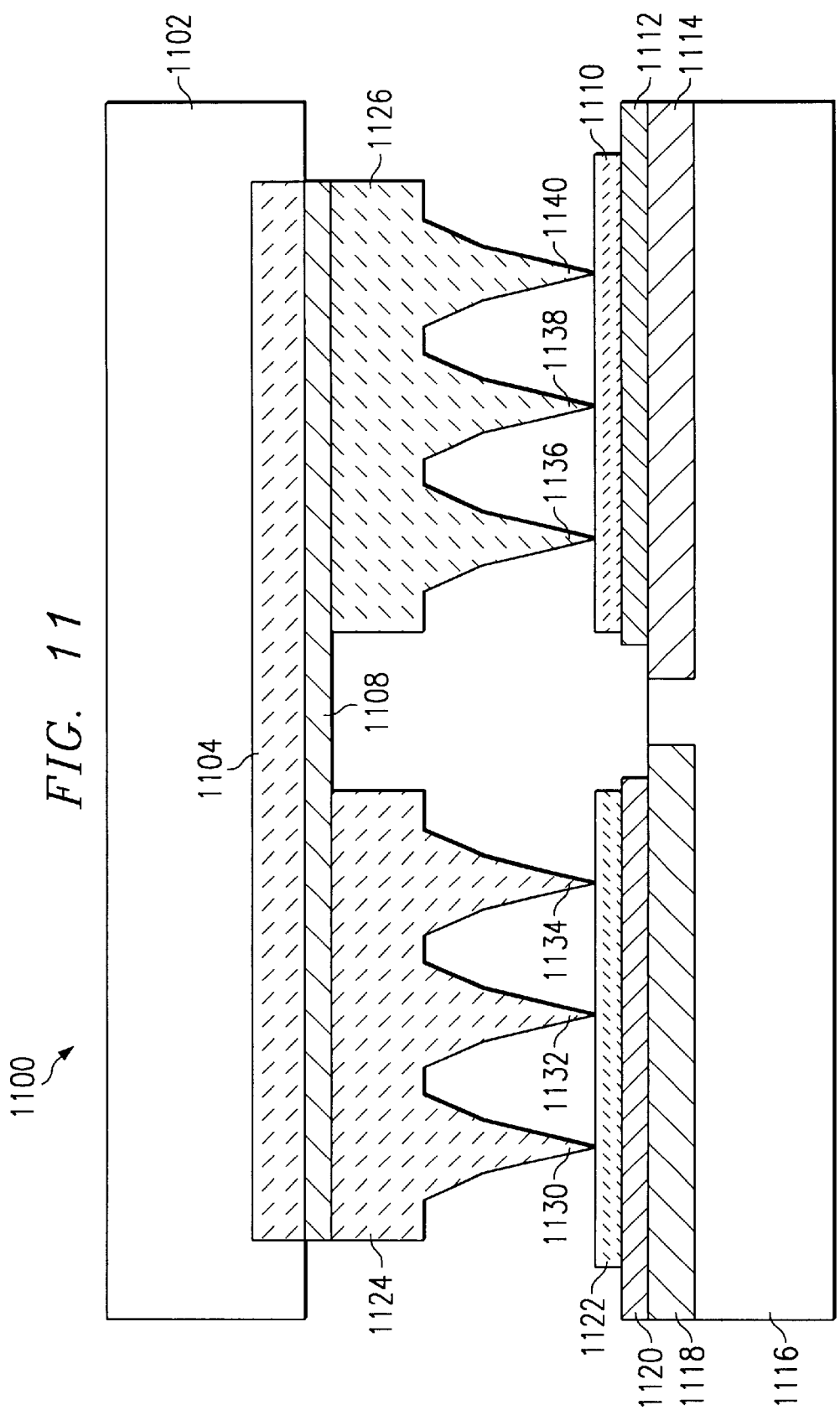
FIG. 11 depicts a cross-sectional view of a thermoelectric cooler with enhanced structural interfaces in which the thermoelectric material rather than the metal conducting layer is formed into tips at the interface in accordance with the present invention.

With reference now to FIG. 11, a cross-sectional view of a thermoelectric cooler with enhanced structural interfaces in which the thermoelectric material rather than the metal conducting layer is formed into tips at the interface is depicted in accordance with the present invention. Thermoelectric cooler 1100 includes a cold plate 1116 and a hot plate 1102, wherein the cold plate is in thermal contact with the substance that is to be cooled. Thermal conductors 1114 and 1118 provide a thermal couple between electrical conducting plates 1112 and 1120 respectively. Thermal conductors 1114 and 1118 are constructed of heavily n doped (n+) semiconducting material that provides electrical isolation between cold plate 1116 and conductors 1112 and 1120 by forming reverse biased diodes with the p– material of the cold plate 1116. Thus, heat is transferred from the cold plate 1116 through conductors 1112 and 1120 and eventually to hot plate 1102 from which it can be dissipated without allowing an electrical coupling between the thermoelectric cooler 1100 and the substance that is to be cooled. Similarly, thermal conductor 1104 provides a thermal connection between electrical conducting plate 1108 and hot plate 1102, while maintaining electrical isolation between the hot plate and electrical conducting plate 1108 by forming a reverse biased diode with the hot plate 1102 p– doped semiconducting material as discussed above. Thermal conductor 1104 is also an n+ type doped semiconducting material. Electrical conducting plates 1108, 1112, and 1120 are constructed from platinum (Pt) in this embodiment. However, other materials that are both electrically conducting and thermally conducting may be utilized as well. Also, it should be mentioned that the areas surrounding tips 1130–1140 and between tips 1130–1140 and thermoelectric materials 1122 and 1110 should be evacuated to produce a vacuum or should be hermetically sealed with a gas, such as, for example, dry nitrogen.

In this embodiment, rather than providing contact between the thermoelements and the heat source (cold end) metal electrode (conductor) through an array of points in the metal electrode as in FIGS. 2 and 6, the array of points of contact between the thermoelement and the metal electrode is provided by an array of points 1130–1140 in the thermoelements 1124 and 1126. In the embodiments described above with reference to FIGS. 2 and 6, the metal electrode at the cold end was formed over silicon tips or alternatively metal patterns were directly etched to form all-metal tips. However, these methods required thermoelectric materials to be deposited over the cold and the hot electrodes by electrochemical methods. The electrodeposited materials tend to be polycrystalline and do not have ultra-planar surfaces. Also, the surface thermoelectric properties may or may not be superior to single crystalline thermoelectric materials. Annealing improves the thermoelectric properties of the polycrystalline materials, but surface smoothness below 100 nm roughness levels remains a problem. The tips 1130–1140 of the present embodiment may be formed from single crystal or polycrystal thermoelectric materials by electrochemical etching.

In one embodiment, thermoelement 1124 is comprised of a super lattice of single crystalline Bi$_2$Te$_3$/Sb$_2$Te$_3$ and Bi$_{0.5}$Sb$_{1.5}$Te$_3$ and thermoelement 1126 is formed of a super lattice of single crystalline Bi$_2$Te$_3$/Bi$_2$Se$_3$ and Bi$_2$Te$_{2.0}$Se$_{0.1}$. Electrically conducting plate 1120 is coated with a thin layer 1122 of the same thermoelectric material as is the material of the tips 1130–1134 that are nearest thin layer 1120. Electrically conducting plate 1112 is coated with a thin layer 1110 of the same thermoelectric material as is the material of the tips 1136–1140 that are nearest thin layer 1112.

Figure 13:
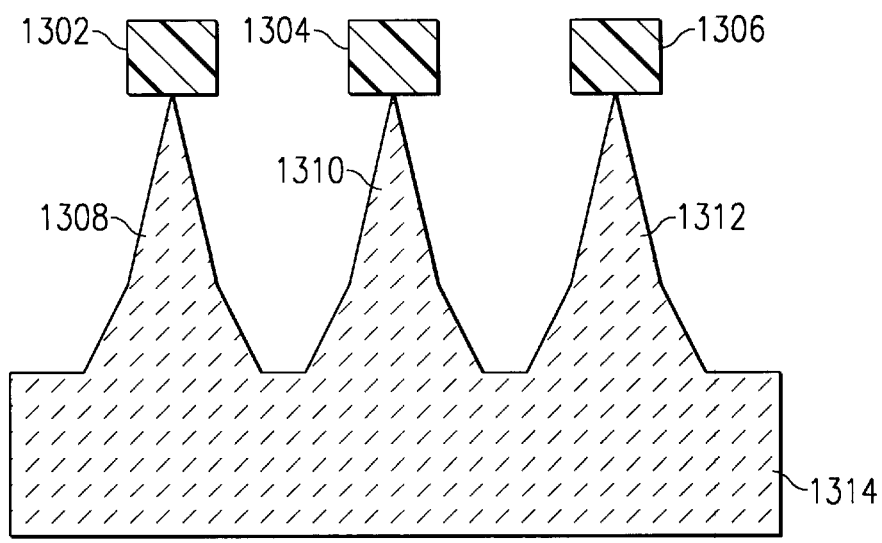
FIG. 13 depicts a cross-sectional diagram illustrating the positioning of photoresist necessary to produce tips in a thermoelectric material.

With reference now to FIG. 12, a flowchart illustrating an exemplary method of fabricating a thermoelectric cooler, such as, for example, thermoelectric cooler 1100 in FIG. 11, is depicted in accordance with the present invention. Optimized single crystal material are first bonded to metal electrodes by conventional means or metal electrodes are deposited onto single crystal materials to form the electrode connection pattern (step 1202). The other side of the thermoelectric material 1314 is then patterned (step 1204) by photoresist 1302–1306 as depicted in FIG. 13 and metal electrodes are used in an electrochemical bath as an anode to electrochemically etch the surface (step 1206). The tips 1308–1312 as depicted in FIG. 13 are formed by controlling and stopping the etching process at appropriate times.

A second single crystal substrate is thinned by chemical-mechanical polishing (step 1208) and then electrochemically etching the entire substrate to nanometer films (step 1210). The second substrate with the ultra-thin substrate forms the cold end and the two substrates (the one with the ultra-thin thermoelectric material and the other with the thermoelectric tips) are clamped together with pressure (step 1212). This structure retains high crystallinity in all regions other than the interface at the tips. Also, the same method can be used to fabricate polycrystalline structures rather than single crystalline structures.

Figure 14:
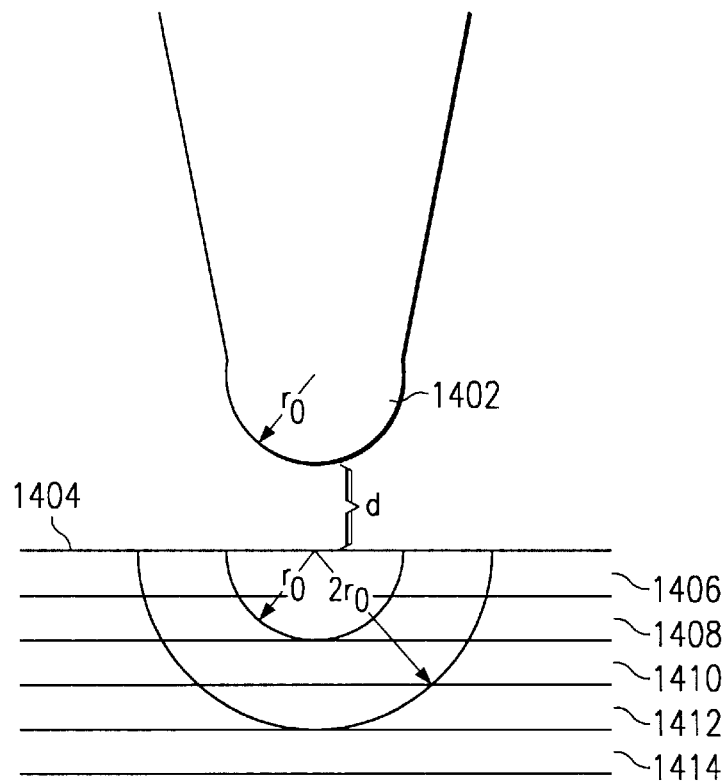
FIG. 14 depicts a diagram showing a cold point tip above a surface for use in a thermoelectric cooler illustrating the positioning of the tip relative to the surface in accordance with the present invention.

With reference now to FIG. 14, a diagram showing a cold point tip above a surface for use in a thermoelectric cooler illustrating the positioning of the tip relative to the surface is depicted in accordance with the present invention. Although the tips, whether created in as all-metal or metal coated tips or as thermoelectric tips have been described thus far as being in contact with the surface opposite the tips. However, although the tips may be in contact with the opposing surface, it is preferable that the tips be near the opposing surface without touching the surface as depicted in FIG. 14. The tip 1402 in FIG. 14 is situated near the opposing surface 1404 but is not in physical contact with the opposing surface. Preferably, the tip 1402 should be a distance d on the order of 5 nanometers or less from the opposing surface 1404. In practice, with a thermoelectric cooler containing thousands of tips, some of the tips may be in contact with the opposing surface while others are not in contact due to the deviations from a perfect plane of the opposing surface.

By removing the tips from contact with the opposing surface, the amount of thermal conductivity between the cold plate and the hot plate of a thermoelectric cooler may be reduced. Electrical conductivity is maintained, however, due to tunneling of electrons between the tips and the opposing surface.

The tips of the present invention have also been described and depicted primarily as perfectly pointed tips. However, as illustrated in FIG. 14, the tips in practice will typically have a slightly more rounded tip as is the case with tip 1402. However, the closer to perfectly pointed the tip is, the fewer number of superlattices needed to achieve the temperature gradient between the cool temperature of the tip and the hot temperature of the hot plate.

Preferably, the radius of curvature $r_0$ of the curved end of the tip 1402 is on the order of a few tens of nanometers. The temperature difference between adjacent areas of the thermoelectric material below surface 1404 approaches zero over a distance of two (2) to three (3) times the radius of curvature $r_0$ of the end of tip 1402. Therefore, only a few layers of the super lattice 1406–1414 are necessary. Thus, a superlattice material opposite the tips is feasible when the electrical contact between the hot and cold plates is made using the tips of the present invention. This is in contrast to the prior art in which to use a superlattice structure without tips, a superlattice of 10000 or more layers was needed to have a sufficient thickness in which to allow the temperature gradient to approach zero. Such a number of layers was impractical, but using only 5 or 6 layers as in the present invention is much more practical.

Although the present invention has been described primarily with reference to a thermoelectric cooling device (or Peltier device) with tipped interfaces used for cooling, it will be recognized by those skilled in the art that the present invention may be utilized for generation of electricity as well. It is well recognized by those skilled in the art that thermoelectric devices can be used either in the Peltier mode (as described above) for refrigeration or in the Seebeck mode for electrical power generation. Referring now to FIG. 15, a schematic diagram of a thermoelectric power generator is depicted. For ease of understanding and explanation of thermoelectric power generation, a thermoelectric power generator according to the prior art is depicted rather than a thermoelectric power generator utilizing cool point tips of the present invention. However, it should be noted that in one embodiment of a thermoelectric power generator according to the present invention, the thermoelements 1506 and 1504 are replaced with cool point tips, as for example, any of the cool point tip embodiments as described in greater detail above.

In a thermoelectric power generator 1500, rather than running current through the thermoelectric device from a power source 102 as indicated in FIG. 1, a temperature differential, $T_H-T_L$, is created across the thermoelectric device 1500. Such temperature differential, $T_H-T_L$, induces a current flow, I, as indicated in FIG. 15 through a resistive load element 1502. This is the opposite mode of operation from the mode of operation described in FIG. 1.

Therefore, other than replacing a power source 102 with a resistor 1502 and maintaining heat elements 1512 and 1516 and constant temperatures $T_H$ and $T_L$ respectively with heat sources $Q_H$ and $Q_L$ respectively, thermoelectric device 1500 is identical in components to thermoelectric device 102 in FIG. 1. Thus, thermoelectric cooling device 1500 utilizes p-type semiconductor 1504 and n-type semiconductor 1506 sandwiched between poor electrical conductors 1508 that have good heat conducting properties. Each of elements 1504, 1506, and 1508 correspond to elements 104, 106, and 108 respectively in FIG. 1. Thermoelectric device 1500 also includes electrical conductors 1510 and 1514 corresponding to electrical conductors 110 and 114 in FIG. 1. More information about thermoelectric electric power generation may be found in *CRC Handbook of Thermoelectrics,* edited by D. M. Rowe, Ph.D., D.Sc., CRC Press, New York, (1995) pp. 479–488 and in *Advanced Engineering Thermodynamics,* 2nd Edition, by Adiran Bejan, John Wiley & Sons, Inc., New York (1997), pp. 675–682, both of which are hereby incorporated herein for all purposes.

The present invention has been described primarily with reference to conically shaped tips, however, other shapes of tips may be utilized as well, such as, for example, pyramidically shaped tips. In fact, the shape of the tip does not need to be symmetric or uniform as long as it provides a discrete set of substantially pointed tips through which electrical conduction between the two ends of a thermoelectric cooler may be provided. The present invention has applications to use in any small refrigeration application, such as, for example, cooling main frame computers, thermal management of hot chips and RF communication circuits, cooling magnetic heads for disk drives, automobile refrigeration, and cooling optical and laser devices.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A thermoelectric device, comprising:
   a planar electrical conductor; and
   a thermoelement composed of a thermoelectric material configured with a plurality of tips which are electrically coupled to the electrical conductor; wherein the tips are made to have an effective tip radius of less than approximately 50 nanometers.

2. The thermoelectric device as recited in claim 1, wherein the thermoelectric material is a single crystalline material.

3. The thermoelectric device as recited in claim 1, wherein the thermoelectric material is a polycrystalline material.

4. The thermoelectric device as recited in claim 1, wherein the thermoelectric material comprises a superlattice of two thermoelectric materials.

5. A thermoelectric device as recited in claim 1, wherein the electrical conductor is constructed from platinum.

6. The thermoelectric device as recited in claim 1, wherein at least one of the plurality of tips is in physical contact with a surface of the electrical conductor.

7. A thermoelectric device, comprising:
   a planar electrical conductor; and
   a thermoelement composed of a thermoelectric material configured with a plurality of tips which are electrically coupled to the electrical conductor;
   wherein the thermoelectric material comprises a superlattice of two thermoelectric materials; and
   wherein the two thermoelectric materials comprise $Bi_{0.5}Sb_{1.5}Te_3$ and $Bi_2Te_3/Sb_2Te_3$.

8. A thermoelectric device, comprising:
   a planar electrical conductor; and
   a thermoelement composed of a thermoelectric material configured with a plurality of tips which are electrically coupled to the electrical conductor;
   wherein the thermoelectric material comprises a superlattice of two thermoelectric materials; and
   wherein the two thermoelectric materials comprise $Bi_2Te_{2.9}Se_{0.1}$ and $Bi_2Te_3/Bi_2Se_3$.

9. A thermoelectric device, comprising:
   a planar electrical conductor;
   a thermoelement composed of a thermoelectric material configured with a plurality of tips which are electrically coupled to the electrical conductor; and
   a layer of thermoelectric material disposed on the electric conductor, wherein the layer of thermoplastic material is comprised of the same impurity type thermoelectric material as the thermoelement.

10. The thermoelectric device as recited in claim 9, wherein at least one of the plurality of tips is not in physical contact with a surface of the electrical conductor.

11. The thermoelectric device as recited in claim 9, wherein extremities of the plurality of tips are nominally within 100 nanometers of a nearest surface of the electrical conductor.

12. A method of fabricating a thermoelectric device having thermoelements with tipped interfaces, the method comprising:
    bonding a first surface of a thermoelectric crystalline material to a metal electrode;
    patterning a photoresist mask onto a second surface of the thermoelectric crystalline material to define locations of tips to be formed; and
    etching the second surface in the presence of the photoresist mask to form a plurality of tips in the thermoelectric crystalline material.

13. The method as recited in claim 12, wherein the thermoelectric crystalline material is a single crystal material.

14. The method as recited in claim 12, wherein the thermoelectric crystalline material is a polycrystalline material.

15. The method as recited in claim 12, the step of etching the second surface of the thermoelectric crystalline material comprises performing an electrochemical etch.

16. The method as recited in claim 12, wherein the thermoelectric device is for use in a thermoelectric cooler.

17. The method as recited in claim 12, wherein the thermoelectric device is for use in a thermoelectric electric power generator.

18. A system of fabricating a thermoelectric device having thermoelements with tipped interfaces, the system comprising:
    means for bonding a first surface of a thermoelectric crystalline material to a metal electrode;
    means for patterning a photoresist mask onto a second surface of the thermoelectric crystalline material to define locations of tips to be formed; and
    means for etching the second surface in the presence of the photoresist mask to form a plurality of tips in the thermoelectric crystalline material.

19. The system as recited in claim 18, wherein the thermoelectric crystalline material is a single crystal material.

20. The system as recited in claim 18, wherein the thermoelectric crystalline material is a polycrystalline material.

21. The system as recited in claim 18, the means for etching the second surface of the thermoelectric crystalline material comprises performing an electrochemical etch.

22. The system as recited in claim 18, wherein the thermoelectric device is for use in a thermoelectric cooler.

23. The system as recited in claim 18, wherein the thermoelectric device is for use in a thermoelectric electric power generator.

* * * * *

UNITED STATES PATENT AND TRADEMARK OFFICE
CERTIFICATE OF CORRECTION

PATENT NO. : 6,608,250 B1
DATED : August 19, 2003
INVENTOR(S) : Ghoshal

It is certified that error appears in the above-identified patent and that said Letters Patent is hereby corrected as shown below:

<u>Column 13,</u>
Line 8, delete "50" and insert -- 500 --.
Line 45, after "layer of", delete "thermoplastic" and insert -- thermoelectric --.

Signed and Sealed this

Twentieth Day of January, 2004

JON W. DUDAS
*Acting Director of the United States Patent and Trademark Office*